United States Patent
Niederer et al.

(10) Patent No.: US 6,601,229 B1
(45) Date of Patent: Jul. 29, 2003

(54) CLIENT/SERVER BEHAVIORAL MODELING AND TESTCASE DEVELOPMENT USING VHDL FOR IMPROVED LOGIC VERIFICATION

(75) Inventors: Theron Paul Niederer, Raleigh, NC (US); Raj Kumar Singh, Cary, NC (US); Michael Raymond Trombley, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/521,990

(22) Filed: Mar. 9, 2000

(51) Int. Cl.$^7$ ............................................. G06F 17/50
(52) U.S. Cl. ................... 716/18; 716/1; 716/2; 716/4; 716/5; 716/6; 716/12; 716/13; 716/16; 716/17
(58) Field of Search .................. 716/1–2, 12–18, 716/4–6

(56) References Cited

U.S. PATENT DOCUMENTS

| | | | |
|---|---|---|---|
| 5,544,067 A | * 8/1996 | Rostoker et al. | 364/489 |
| 5,572,437 A | * 11/1996 | Rostoker et al. | 364/489 |
| 5,812,780 A | 9/1998 | Chen et al. | 395/200.54 |
| 5,910,898 A | * 6/1999 | Johannsen | 364/489 |
| 5,953,519 A | 9/1999 | Fura | 395/500.19 |
| 5,960,188 A | 9/1999 | Linke et al. | 395/500.35 |
| 5,966,707 A | * 10/1999 | Van Huben et al. | 707/10 |
| 5,991,523 A | * 11/1999 | Williams et al. | 395/500.19 |
| 5,999,734 A | * 12/1999 | Willis et al. | 395/706 |
| 6,157,947 A | * 12/2000 | Watanabe et al. | 709/217 |
| 6,208,954 B1 | * 3/2001 | Houtchens | 703/16 |
| 6,272,523 B1 | * 8/2001 | Factor | 709/201 |

OTHER PUBLICATIONS

G. Stamatakos, "Using web technology and Meta–computing to Visualize a Simplified stimulation model . . . " Information Tech. Applications in Biomedicine 1999 IEEE EMBS intern. Confer. p. 31–32.*

Tsai, "Intelligent E–mail Management System" 0–7803–5731–0 IEEE 1999 p. V–824–829.*

* cited by examiner

Primary Examiner—Matthew Smith
Assistant Examiner—Granvill D Lee, Jr.

(57) ABSTRACT

A system, method and computer program features of the present invention, relate to verification or simulation of a design using a behavioral model structure for use in a Client/Server configuration. A physical part presents the external interface, and a functional procedural part which is comprised of at least one VHDL process. A testcase is a set of procedure calls written in VHDL. The present invention describes the architecture and implementation of a client/server behavioral model and procedural approach for testcase development which results in significant gain in productivity, quality of logic verification, and portability.

11 Claims, 3 Drawing Sheets

Many-to-One and One-to-One Access Modes

Many-to-One and One-to-One Access Modes

CLIENT/SERVER BEHAVIORAL MODELING AND TESTCASE DEVELOPMENT USING VHDL FOR IMPROVED LOGIC VERIFICATION

TECHNICAL FIELD

The present invention relates to verification or simulation of a design using behavioral models structured in a Client/Server configuration. Each model consists of a physical part which presents the external interface, and a functional part which stores the state of the model and presents an internal procedural interface. A testcase is a set of procedure calls which exercise such models written in VHDL.

BACKGROUND OF THE INVENTION AND PRIOR ART

Logic verification is a large and growing component of an ASIC design and development effort. Based on the experiences of past design efforts, it has become immensely clear that the number of testcases written during the course of a project (on the order of hundreds) far out numbers the total number of behavioral models (on the order of tens) which comprise a typical testbench. A large fraction of all verification resource is consumed in writing and debugging the large set of testcases. This impacts directly the quality of logic verification achievable with in the project resource constraints.

SUMMARY OF THE INVENTION

A system, method and computer program features of the present invention, relate to verification or simulation of a design using behavioral models structured in a Client/Server configuration. Each model consists of a physical part which presents the external interface, and a functional part which stores the state of the model and presents an internal procedural interface. A testcase is a set of procedure calls which exercise such models, written in VHDL. The present invention describes the architecture and implementation of a client/server behavioral model and procedural approach for testcase development which results in significant gain in productivity, quality of logic verification, and portability.

DETAILED DESCRIPTION OF THE PREFERRED EMBODIMENT

Before setting forth the present invention, we should establish some basic definitions used throughput this patent application.

VHDL This represents VHSIC Hardware Description language Very High Speed Integrated Circuit an IEEE standard language for describing and simulating ICs.

FLI Foreign Language Interface—An interface to Code written in another (not VHDL) language and complied outside the simulator.

UUT acronym for unit under test.

Figure 1:
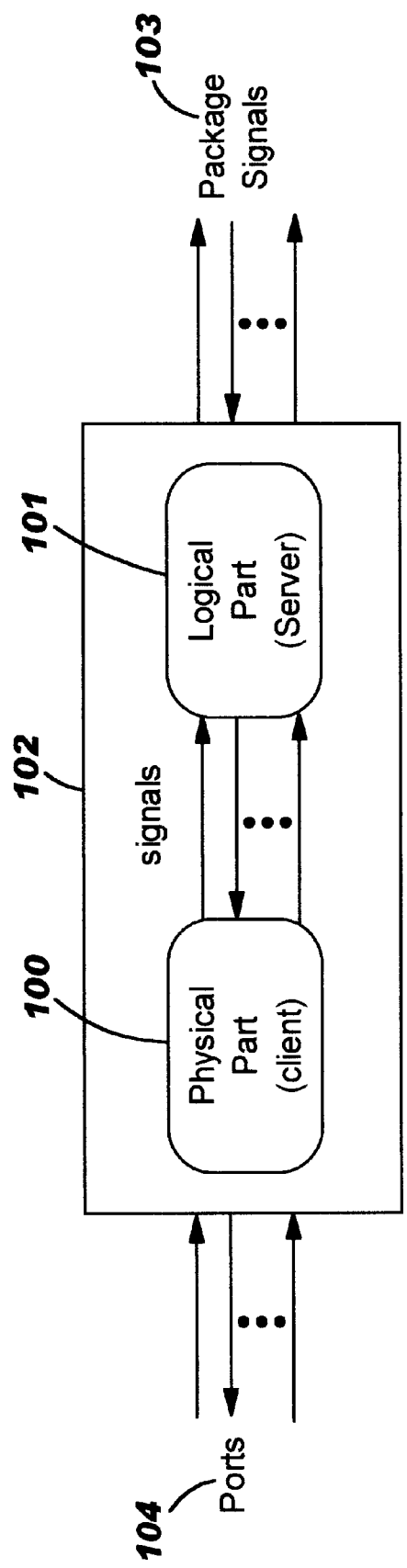
FIG. 1 represents an Architecture of a Client-Server Model.

The present invention solves the problem in the following manner. A behavioral model typically specifies the external view of the device along with one or more internal views. The internal view of the device specifies the functionality, while the external view specifies the interface of the device through which it communicates with other component s in a system environment. In a client/server approach, (FIG. 1 at location 102) a model's architecture is composed of two parts. These parts can be labelled in various ways but for this discussion the client part will be called the "physical" part (FIG. 1 at location 100) and the "server part" (101) will be called the "logical" part (see FIG. 1 which represents an Architecture of a Client-Server Model). The "physical" part presents a real interface which conforms to the specification of the logic to which it is attached while the "logical" part (location FIG. 1 at 101) stores the state of the model and provides a procedural (Object Oriented) interface to any other models or testcases that may need to communicate with it.

The "logical" part stores and maintains the state of the model based on interactions with the "physical" part and procedure requests from other models and testcase. The "logical" part is comprised of internal data structures (e.g., records, link-list queues, etc.), at least one VHDL process, and a set of procedural methods for accessing and manipulating the internal data structures. The set of procedural methods, commands, and a global arbitration control signal are defined in an associated package 103, whereas the actual method implementations are described in the package body.

The "physical" part provides ports (104) for connecting the model to external interfaces presented by other models and/or the ASIC under development. It is comprised of a thin layer of code which presents information from the "logical" part according to the rules of the external interface. The "physical" process also adheres to the device timing specifications which results in simulation time advancement. Once the port definition is firmed up, the testbench becomes isolated from the functional changes being made in the "logical" part. The "physical" process communicates with the "logical" process to gain access to the internal data via an internal request-grant mechanism implemented using signals and/or shared variables.

Figure 3:
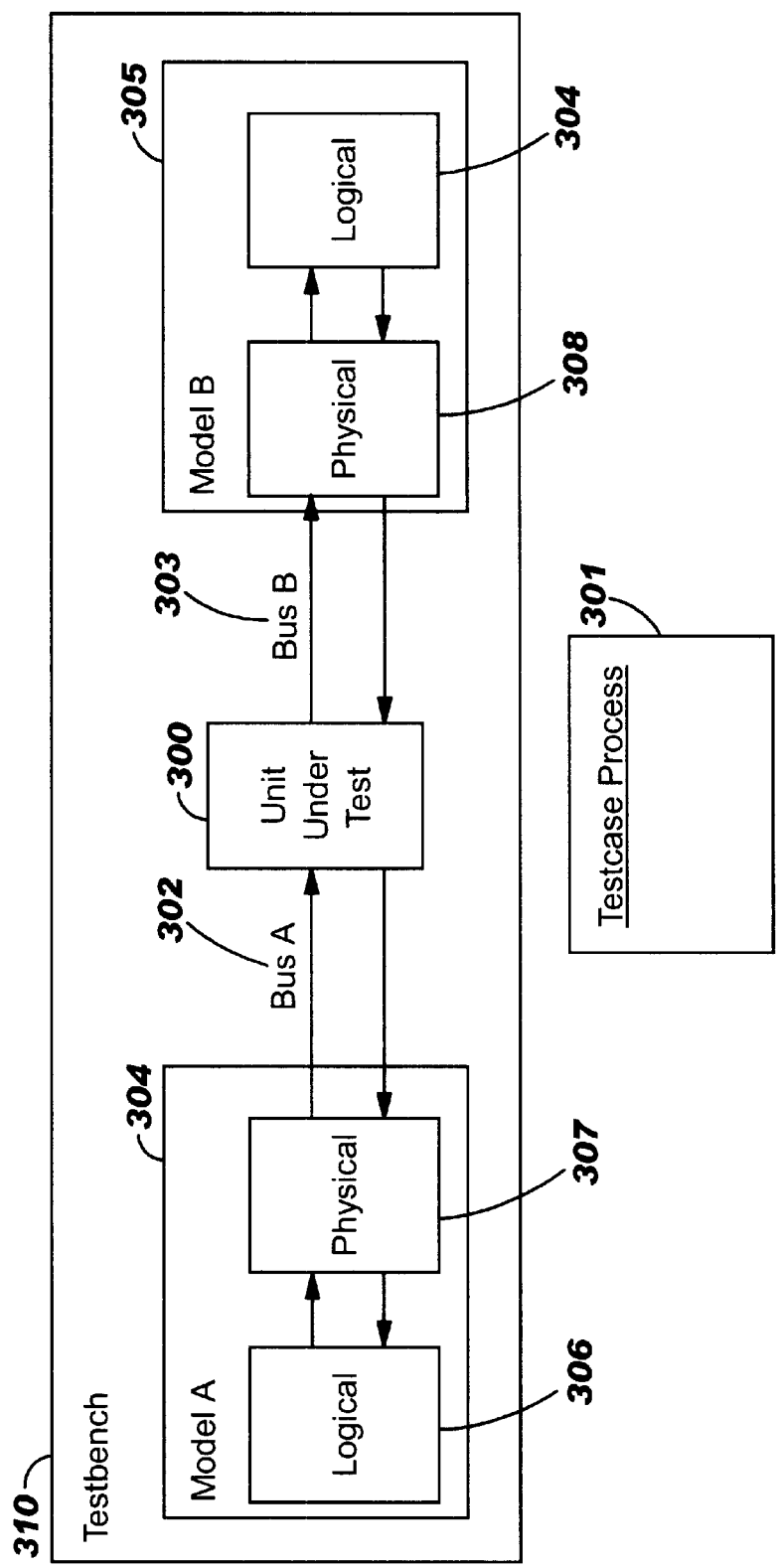
FIG. 3 demonstrates an Example of a Testcase operation.

For an example, if the testcase (FIG. 3 at 301) wishes to verify that the unit under test FIG. 3 at location 300, performs its function correctly (which is to translate from Bus A, at 302, to bus B at location 303) under some set of conditions. The way that this will happen is that the testcase process will communicate with logical portions of models A, at 304, and B at location 304 causing them to set-up the desired conditions. This communication takes place by a method described in application Ser. No. 09/505,105, which is incorporated herein by reference. The testca procedure in the logical part (306) of Model A, which causes model A (304) to send a transaction through the unit under test (300), to model B (305). This action will cause information to be transferred between the logical and physical (307) parts of model A, the physical part of model A and the unit under test (300), the unit under test and the physical part (308) of model B, and lastly between the physical logical parts of model B (308).

The details of all of these information transfers are not of great importance, except to note that the logical parts of models A and B both initiate the action within the testbench (310) and collect the results. They also provide the interface to the testcase which is an external process. These functions are analogous to a traditional Server. The testcase and the physical parts of model A and B request services and information from the logical parts, and are thus analogous to clients.

Figure 2:
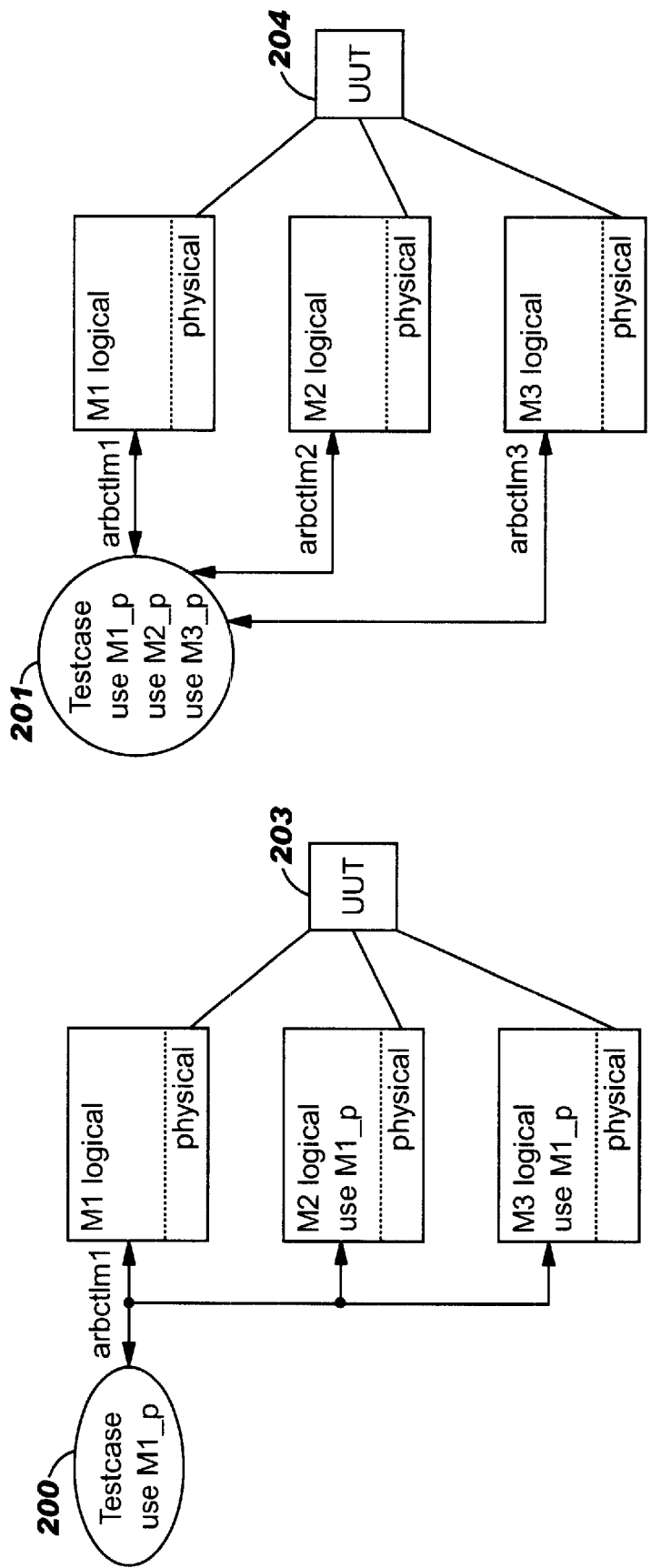
FIG. 2 demonstrates the structure of "Many-to One" and "One-to One" Access Modes.

The model supports multiple concurrent accesses in a many-to-one access mode using procedures published in its package which use a built-in arbitration mechanism on model's global arbitration control signal (see FIG. 2). The units under test are noted at 203 and 204 respectively. The model also supports one-to-one (location 200) and one-to-many (201) modes of communication via a set of unique global signals declared in the associated package.

A testcase can request operations that a model is capable of performing by invoking the methods associated with the model. A testcase with this approach is simply a series of procedure calls which is easier to develop and debug. This helps increase the productivity tremendously. This approach is scalable in that the models can extend their repertoire of services incrementally on a as-needed basis. Since the testcases are written in the VHDL language exclusively, it makes them portable across simulator and workstation platforms.

While the invention has been described with respect to a specific embodiment, it will be obvious to those skilled in this art that changes in both form and/or detail may be made without a departure from the scope and/or spirit of the invention.

We claim:

1. A computer base system for client/server behavioral modeling and testcase development, employing VHDL language for improved logic verification, comprising;

means for separation of external interfaces, in a Client/Server environment having a physical part and a server part or logical part, including the procedural part in VHDL;

means for applying the architecture and implementation of a client/server behavioral model wherein said model supports multiple concurrent access in a many-to-one access mode, employing published procedures, which use built in arbitration mechanism on said model's global arbitration control signal; and also supports one-to-one and one-to many modes of communication via a set of global signals and the procedural approach for testcase development, thereby resulting in increased productivity, quality and logic verification.

2. A computer base system for client/server behavioral modeling and testcase development, employing VHDL language for improved logic verification, comprising;

means for separation of external interfaces, in a Client/Server environment, including the procedural part in VHDL;

means for applying the architecture and implementation of a client server behavioral model and the procedural approach for testcase development, wherein a testcase is simply a series of procedure calls which are easy to develop and debug and can request operations that said model capable of performing, thereby resulting in increased productivity, quality and logic verification.

3. The system of claim 2, wherein the architecture, including a physical part and a logical part, is scaleable in that said models can extend their repertoire of services incrementally on a as-needed basis, and said testcases are written in said VHDL language exclusively,making them portable across simulator and said workstation platforms.

4. A computer base method for client/server behavioral modeling and testcase development, employing VHDL language for improved logic verification, comprising the steps of;

separating of the external part, in a Client/Server environment having a physical part and server part or logical part, including the procedural part in VHDL;

applying the architecture and implementation of a client/server behavioral model wherein said model supports concurrent access in a many-to-one access mode, employing published procedures, which use built in arbitration mechanism on said model's global arbitration control signal;

also supports one-to-one and one-to-many modes of communication via a set of global signals and variables and the procedural approach for testcase development resulting in increased productivity, quality and logic verification.

5. A computer base system for client/server behavioral modeling and testcase development, employing VHDL language for improved logic verification, comprising:

means for separation of external interfaces, in a Client/Server environment, including the procedural part in VHDL;

means for applying the architecture and implementation of a client/server behavioral model and the procedural approach for testcase, a simple series of procedure calls which are easy to develop and debug and requests operations that said model capable of performing thereby resulting in increased productivity, quality and logic verification.

6. The method of claim 5, wherein the architecture, including a physical part and a logical part, is scaleable in that said models can extend their repertoire of services incrementally on a as-needed basis, and said testcases are written In said VHDL language exclusively, it makes them portable across simulator and said workstation platforms.

7. A computer readable program having data structures included on a computer readable medium which causes the display on a data processor controlled display of a computer base system for client/server behavioral modeling and testcase development, employing VHDL language for improved logic verification, comprising;

means for separation of external interfaces, in a Client/Server environment having a physical part and a server part or logical part, including the procedural part in VHDL;

means for applying the architecture and implementation of a client/server behavioral model supporting multiple concurrent access in a many-to-one access mode, employing published procedures, which use built in arbitration mechanism on said model's global arbitration control signal; and also supports one-to-one and one-to many modes of communication via a set of global signals and variables and the procedural approach for testcase development, and results in increased productivity, quality and logic verification.

8. The program of claim 7, wherein a testcase can request operations that said model capable of performing, by invoking the methods associated with said model and a testcase is simply a series of procedure calls which are easy to develop and debug.

9. The program of claim 8, wherein the architecture, including a physical part and a logical part, is scaleable in that said models can extend their repertoire of services incrementally on a as-needed basis, and said testcases are written in said VHDL language exclusively, it makes them portable across simulator and said workstation platforms.

10. A method for verifying an electronic design comprising the acts of:

providing a physical part that provides ports to connect to external interfaces, timing mechanism that conforms to timing requirements of the external interfaces and logic to present information according to rules of said external interfaces;

providing a logical part to connect to the physical part, said logical part including data structures such as records and link-list queues at least one VHDL process and at least one set of procedural methods for accessing and manipulating the data structures;

providing a test case generator with routines to issue calls requesting operations which the logical part can provide; and electing a routine that causes a desired operation to be exercised on an external interface.

11. A system for testing devices including:

a physical part that provides ports to connect to external interfaces, timing mechanism that conforms to timing requirements of the external interfaces and logic to present information according to rules of said external interfaces;

a logical part to connect to the physical part, said logical part including data structures such as records and link-list queues at least one VHDL process and at least one set of procedural methods for accessing and manipulating the internal data structures; and a test case generator with routines to issue calls requesting operations which the logical part can provide.

* * * * *